(12) United States Patent
Bennett

(10) Patent No.: US 8,711,027 B1
(45) Date of Patent: Apr. 29, 2014

(54) ANALOG-TO-DIGITAL CONVERTER WITH INPUT VOLTAGE BIASING DC LEVEL OF RESONANT OSCILLATOR

(71) Applicant: Western Digital Technologies, Inc., Irvine, CA (US)

(72) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/681,371

(22) Filed: Nov. 19, 2012

(51) Int. Cl.
*H03M 1/50* (2006.01)

(52) U.S. Cl.
USPC .......................................... 341/166; 341/157

(58) Field of Classification Search
USPC .................................. 341/111, 155, 157, 166
See application file for complete search history.

(56) References Cited

U.S. PATENT DOCUMENTS

| | | | |
|---|---|---|---|
| 3,868,677 A * | 2/1975 | Kidd | 341/157 |
| 4,859,969 A | 8/1989 | Malinowski et al. | |
| 6,341,048 B1 | 1/2002 | Morris et al. | |
| 6,549,083 B2 | 4/2003 | Kanazawa et al. | |
| 7,259,636 B2 | 8/2007 | Oita | |
| 7,561,091 B1 | 7/2009 | Muenter et al. | |
| 8,077,420 B2 | 12/2011 | Tanner | |
| 8,081,101 B2 * | 12/2011 | Daniels et al. | 341/157 |
| 8,159,308 B1 * | 4/2012 | Sutardja | 331/117 FE |
| 8,421,663 B1 * | 4/2013 | Bennett | 341/155 |
| 2007/0074077 A1 | 3/2007 | Markow et al. | |
| 2012/0194369 A1 * | 8/2012 | Galton et al. | 341/120 |

* cited by examiner

*Primary Examiner* — Howard Williams

(57) ABSTRACT

An analog-to-digital converter is disclosed comprising a resonant oscillator comprising an input operable to receive an analog input signal and an output operable to output an oscillating signal. A DC offset detector detects a DC offset in the oscillating signal caused by the analog input signal, wherein the DC offset is converted into a digital output signal representing the analog input signal.

22 Claims, 8 Drawing Sheets

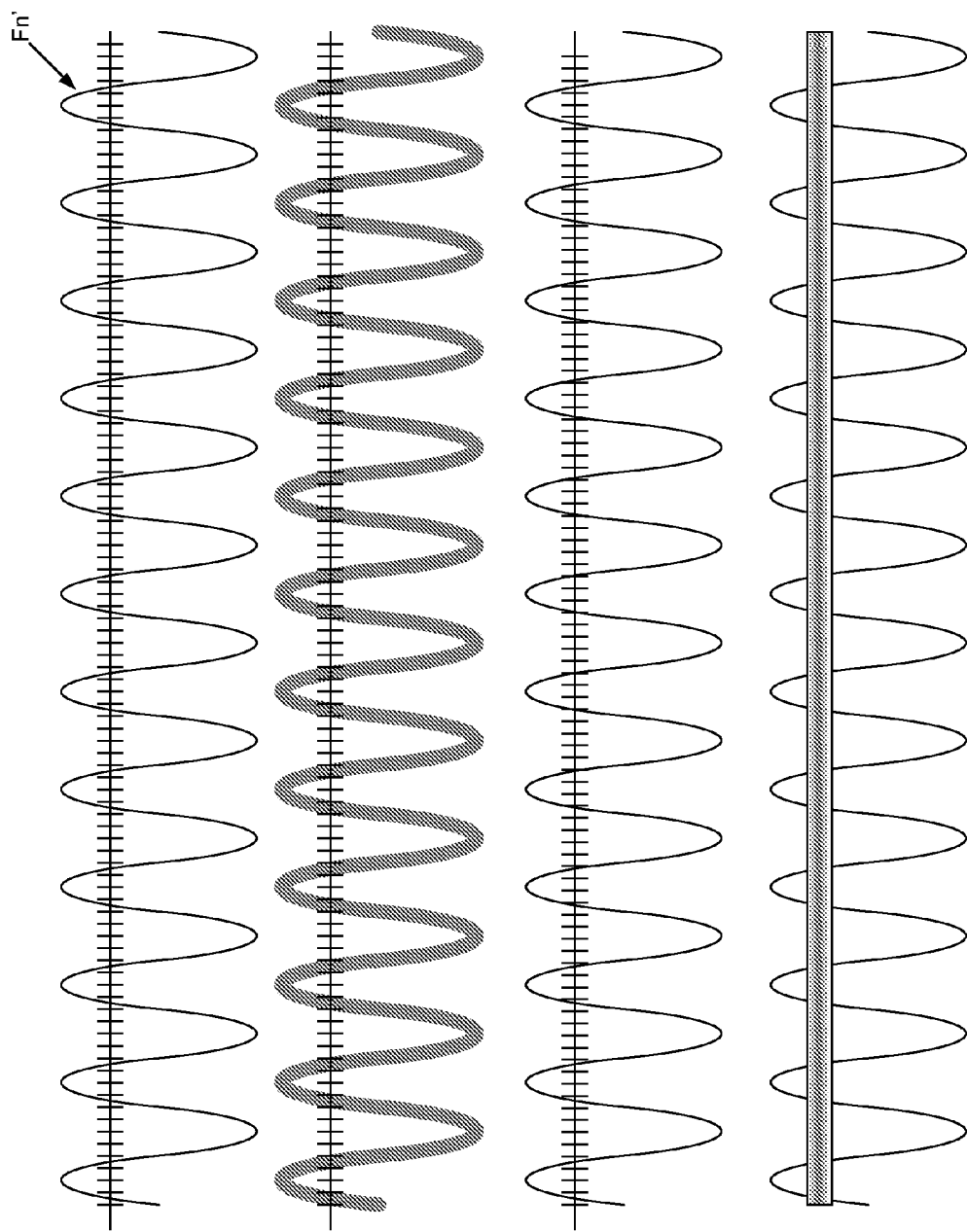

ANALOG-TO-DIGITAL CONVERTER WITH INPUT VOLTAGE BIASING DC LEVEL OF RESONANT OSCILLATOR

BACKGROUND

Analog-to-digital converters are ubiquitous in electronic devices, including consumer and industrial devices. Converting an analog input voltage into a digital value enables digital processing to achieve any desirable result, such as converting an analog voltage generated by a sensor into a digital value that can be processed to detect any particular condition. For example, disk drives may employ one or more sensors for detecting vibrations that may adversely affect the servo control system responsible for maintaining the head over a data track during write/read operations. It may be desirable to process these vibration signals digitally in order to provide feed-forward compensation to the servo control system, thereby compensating for the vibrations in real time.

BRIEF DESCRIPTION OF THE DRAWINGS

FIGS. 8A-8D show embodiments of the present invention for increasing a resolution of the analog-to-digital converter.

DETAILED DESCRIPTION

Figure 1:
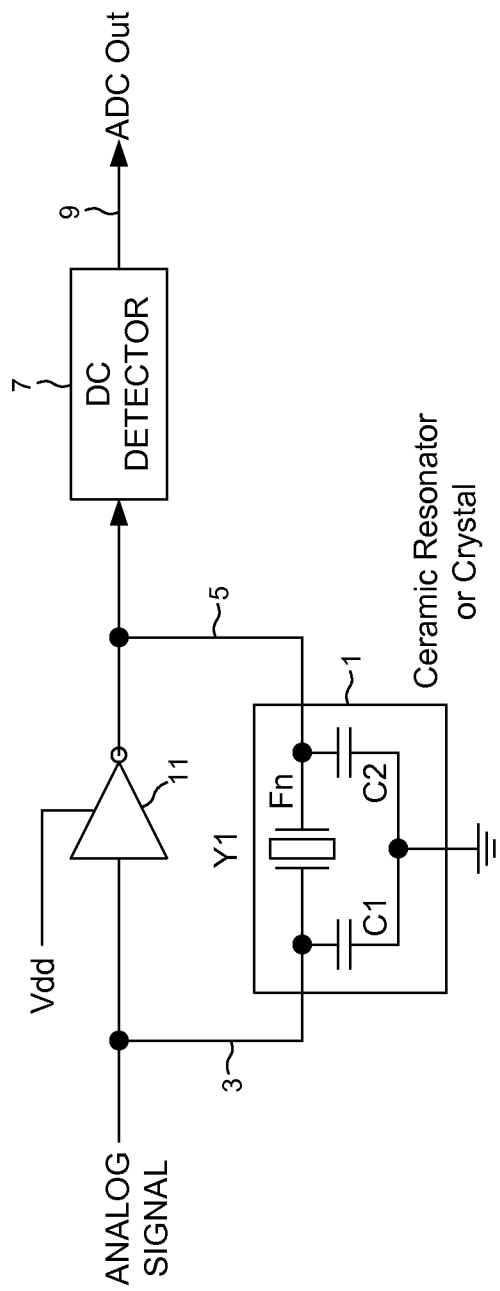
FIG. 1 shows an analog-to-digital converter according to an embodiment of the present invention comprising a resonant oscillator biased by an analog input signal, and a DC detector operable to convert a DC offset in the oscillating signal into a digital output signal.

FIG. 1 shows an analog-to-digital converter according to an embodiment of the present invention comprising a resonant oscillator 1 comprising an input operable to receive an analog input signal 3 and an output operable to output an oscillating signal 5. A DC offset detector 7 is operable to detect a DC offset in the oscillating signal 5 caused by the analog input signal 3, wherein the DC offset is converted into a digital output signal 9 representing the analog input signal 3.

In the embodiment shown in FIG. 1, the analog-to-digital converter comprises a suitable inverting amplifier 11 which is coupled to the resonant oscillator 1 so that the resonant oscillator oscillates at a resonant frequency. Any suitable resonant oscillator 1 may be employed in the embodiments of the present invention, such as a crystal, or ceramic resonator, or a silicon oscillator. In one embodiment, the analog input signal 3 biases the resonant oscillator 1 which causes a DC offset in the oscillating signal 5. The DC offset detector 7 is operable to convert the DC offset in the oscillating signal 5 into the digital output signal 9.

Figure 2:
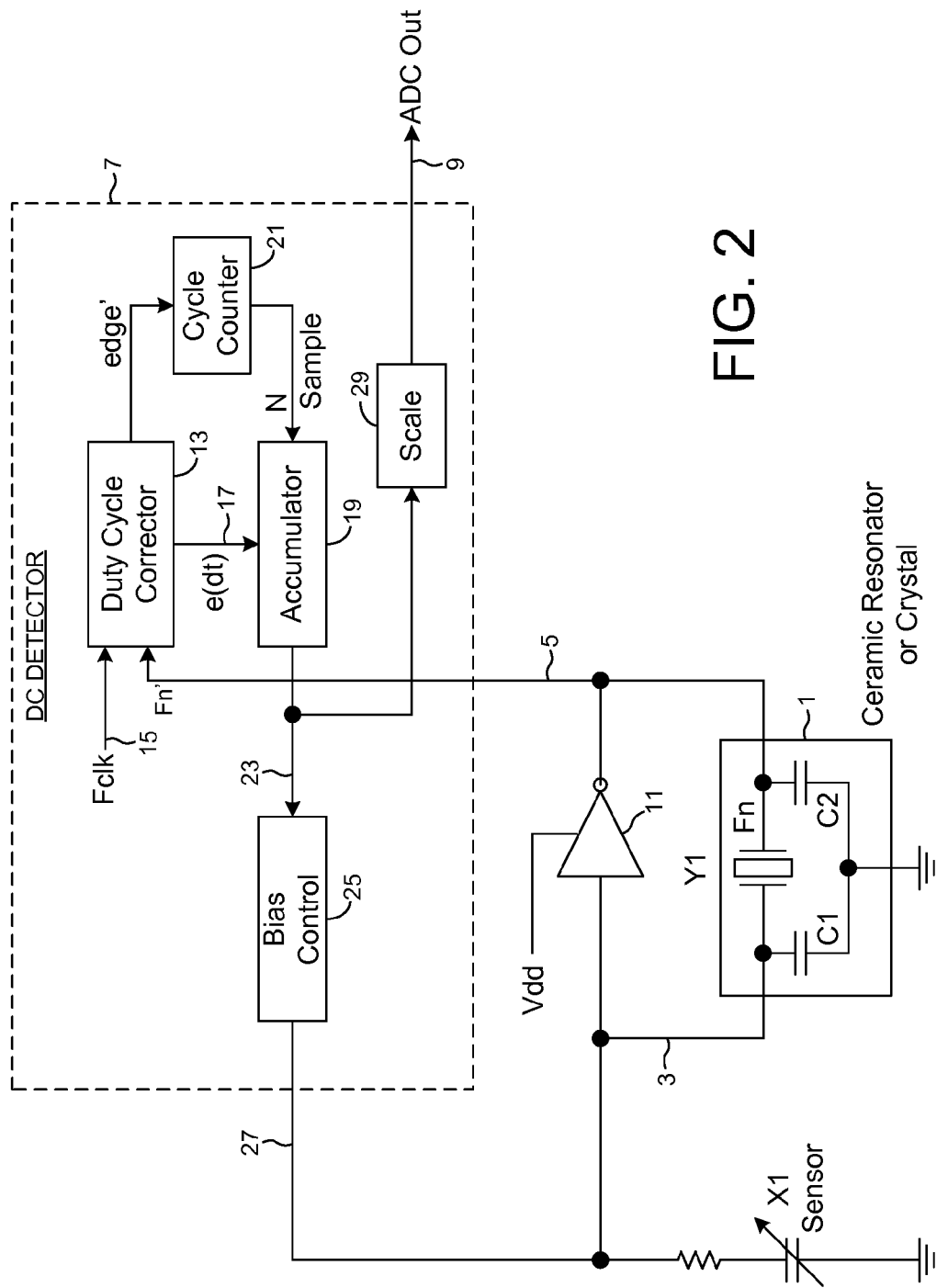
FIG. 2 shows details of a DC detector according to an embodiment of the present invention.

The analog input signal 3 may be generated by any suitable source, and in one embodiment shown in FIG. 2, the analog input signal 3 is generated by a suitable sensor, such as a suitable accelerometer in a disk drive for transducing a physical vibration into an analog vibration signal. The embodiment of FIG. 2 also shows an embodiment of the DC detector 7 for converting the DC offset in the oscillating signal 5 into the digital output signal 9. A duty cycle corrector 13 processes the oscillating signal 5 and a fast clock 15 oscillating at a frequency significantly higher than the oscillating signal 5 to detect a time delta dt 17 representing a difference in time that the oscillating signal 5 is above a threshold and below a threshold. The time delta dt 17 is accumulated 19 over N cycles of the oscillating signal 5 as counted by a cycle counter 21 to generate an accumulated time delta 23. A bias control 25 processes the accumulated time delta 23 to generate a bias signal 27 that drives the DC offset in the oscillating signal 5 toward zero. The accumulated time delta 23 is scaled 29 to thereby generate the digital output signal 9 representing the analog input signal 3. Accordingly in this embodiment the DC detector 7 operates as a closed-loop feedback system which attempts to maintain the DC offset in the oscillating signal 5 at zero by driving the bias control 25 with a control signal that is a digital representation of the analog input signal 3.

Figure 3:
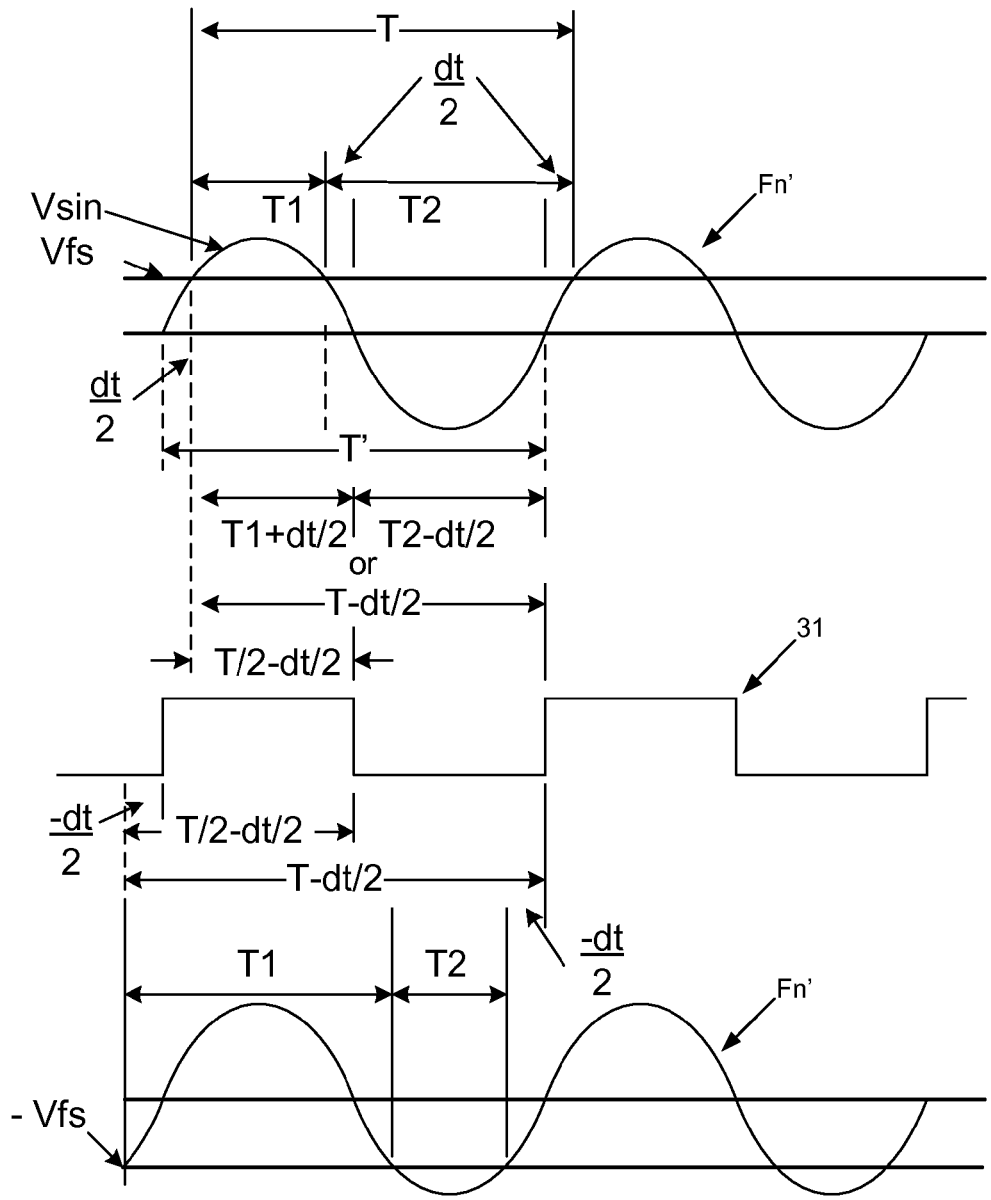
FIG. 3 is a timing diagram that illustrates operation of the DC detector according to an embodiment of the present invention.

FIG. 3 is a timing diagram that illustrates operation of the DC offset detector 7 according to an embodiment of the present invention. The DC offset detector 7 comprises a comparator that splits the sine wave of the oscillating signal Fn' 5 into positive (above threshold) and negative (below threshold) components. Counters then measure the positive half cycle (T1) and the negative half cycle (T2). When there is a DC offset in the oscillating signal Fn' 5, these two timings will not be equal. The total difference in timing between the two halves of the waveform (T2−T1) is stored as dt. The output positive edge of the square wave 31 shown in FIG. 3 is therefore advanced by dt/2, and the negative edge is delayed by dt/2. The result is a waveform having a substantially fifty percent duty cycle. The top sine wave shown in FIG. 3 shows the case where the DC offset is negative and therefore dt/2 is positive, and the bottom sine wave shown in FIG. 3 shows the case where the DC offset is positive, and therefore dt/2 is negative.

Figure 4:
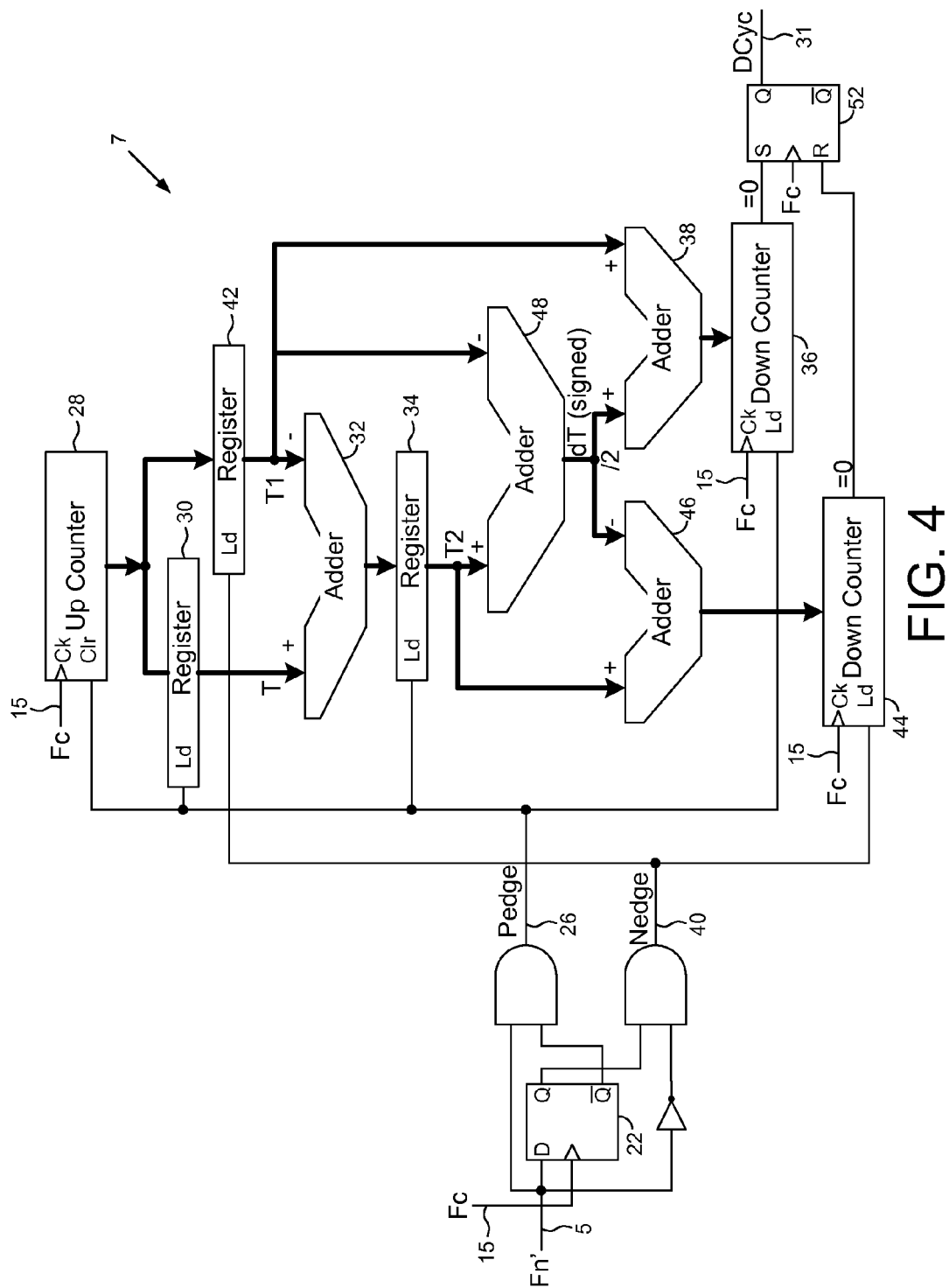
FIG. 4 shows an embodiment of the DC detector according to an embodiment of the present invention.

FIG. 4 shows an embodiment of the DC offset detector 7 wherein a D-type register 22 is clocked by the fast clock Fc 15, and the threshold of the D-type register 22 corresponds to Vfs in FIG. 3 and establishes the DC offset in the oscillating signal Fn' 5. When the oscillating signal Fn' 5 rises above the threshold, a Pedge signal 26 is active which loads the output of up counter 28 into register 30, loads an output of an adder 32 into register 34, and loads a down counter 36 with the output of an adder 38. The Pedge signal 26 also clears up counter 28. When the oscillating signal Fn' 5 falls below the threshold of the D-type register 22, a Nedge signal 40 is active which loads the output of up counter 28 into register 42, and loads a down counter 44 with the output of an adder 46. Accordingly, register 30 will store T after a full cycle of the oscillating signal Fn' 5, and register 42 will store T1. The output of adder 32 will be (T−T1=T2) which is stored in register 34. The output of adder 48 will be (T2−T1=dt) which is divided by 2 to generate dt/2. The output of adder 46 will be (T2−dt/2), and the output of adder 38 will be (T1+dt/2). The down counter 36 will therefore count the on-time of the square wave 31 shown in FIG. 3, and the down counter 44 will count the off-time of the square wave 31 shown in FIG. 3 via an SR-type register 52. The resulting square wave 31 will have a substantially fifty percent duty cycle after compensating for the DC offset in the oscillating signal Fn' 5.

Figures 5A, 5B:
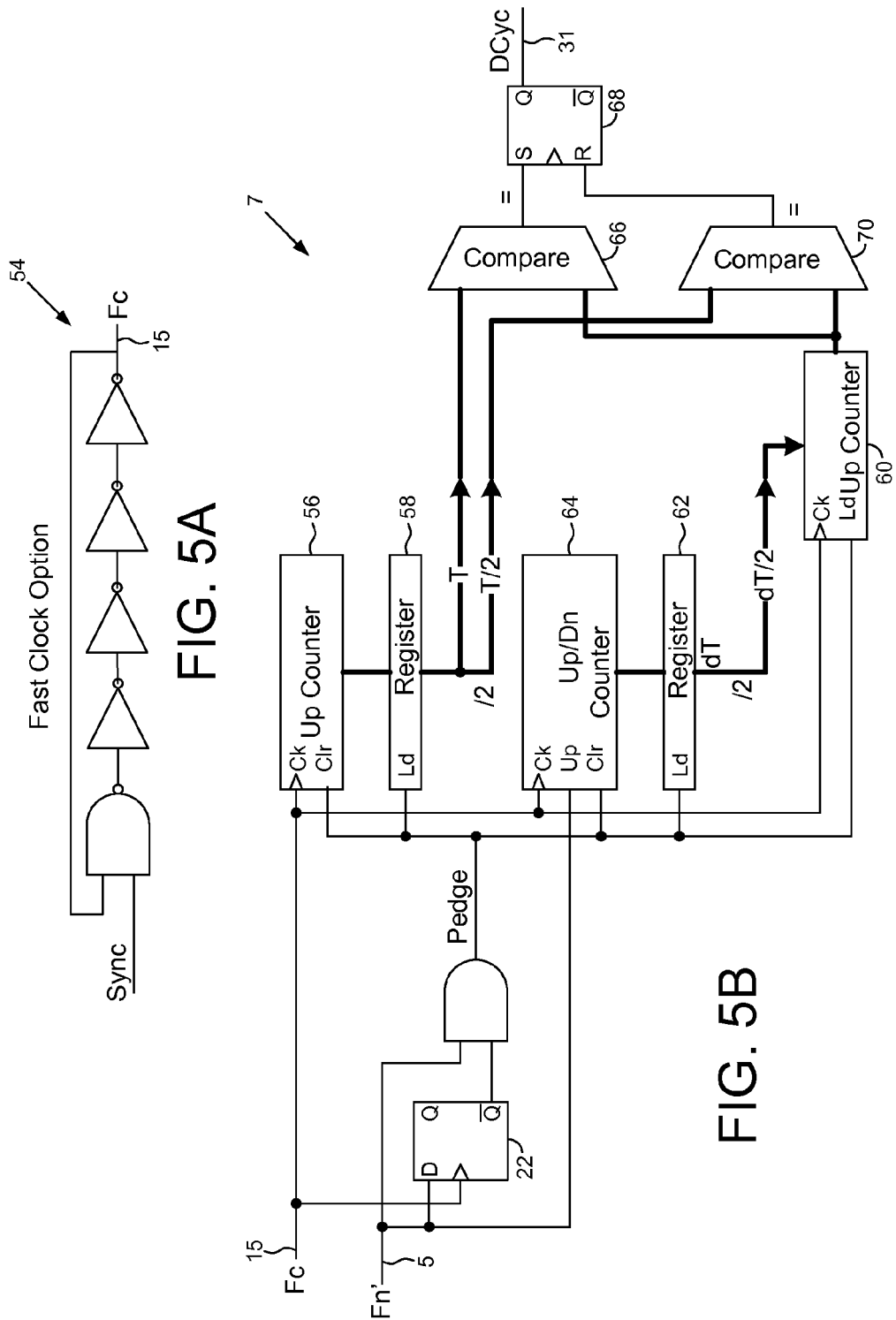
FIG. 5A shows a ring oscillator for generating a fast clock applied to the DC detector according to an embodiment of the present invention.
FIG. 5B shows an embodiment of the DC detector according to an embodiment of the present invention.

FIG. 5A shows an embodiment of the present invention wherein the fast clock Fc 15 applied to the DC offset detector 7 is generated using a ring oscillator 54. FIG. 5B shows an alternative embodiment for the DC offset detector 7 that implements the same computations as the embodiment shown in FIG. 4. In this embodiment, the Pedge signal 26 loads the output of an up counter 56 (i.e., T) into a register 58, and loads an up counter 60 with the output of register 62 divided by two (i.e., dt/2). The Pedge signal also clears the up counter 56 and an up/down counter 64 after each cycle of the oscillating signal Fn' 5. The counting direction of the up/down counter 64 is controlled by the polarity of the oscillating signal Fn' 5 such that the output of the up/down counter 64 after a cycle of the oscillating signal Fn' 5 equals dt which is loaded into register 62. A comparator 66 compares the output of register 58 (i.e., T) to the output of up counter 60. When time equals T−dt/2, an SR-type register 68 is set high to time the on-time of the square wave 31. A comparator 70 compares the output of register 58 divided by two (T/2) to the output of up counter 60. When time equals T−T/2 the SR-type register 68 is set low to time the off-time of the square wave 31.

Figure 6:
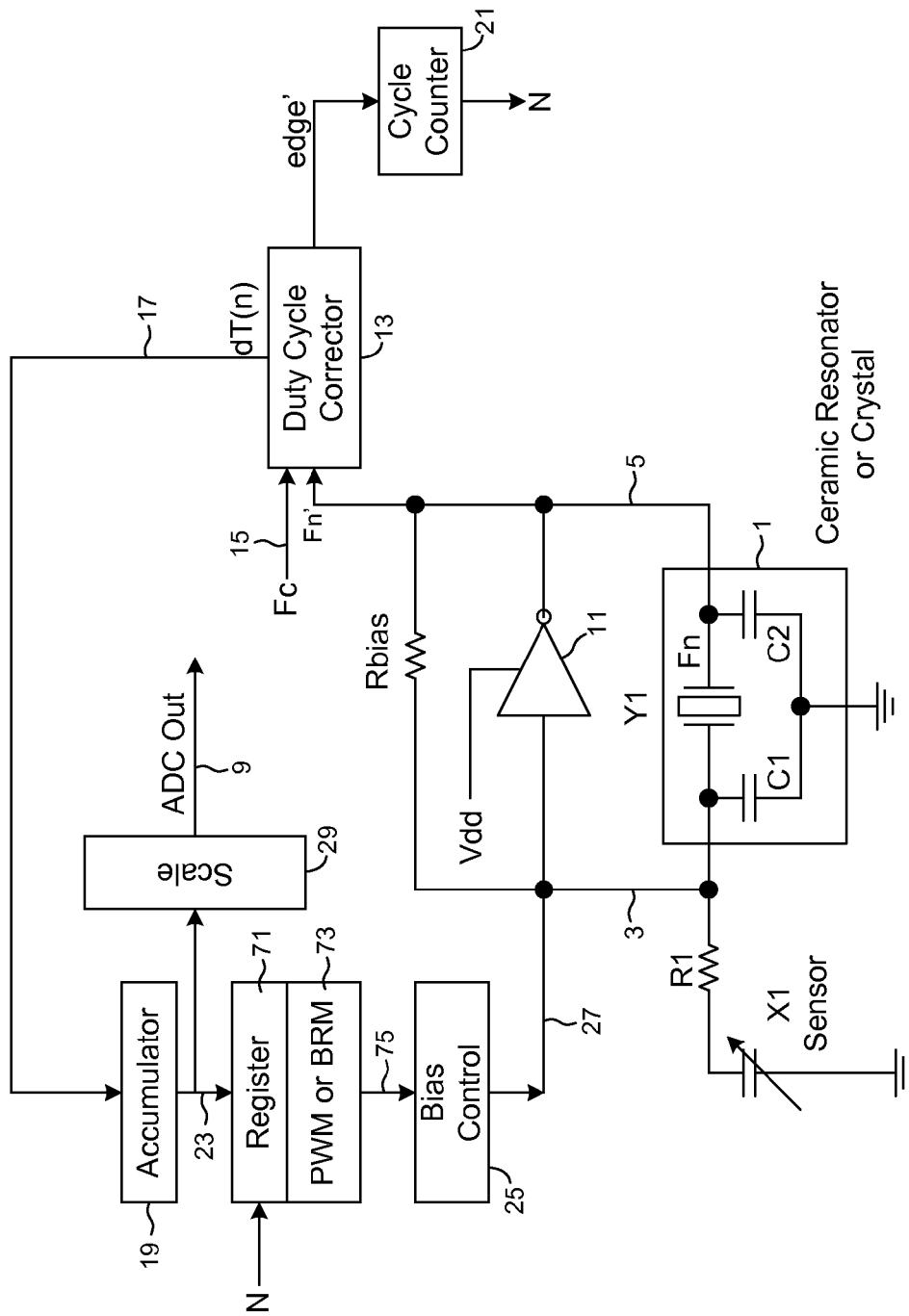
FIG. 6 shows an embodiment of the DC detector according to an embodiment of the present invention.

FIG. 6 shows an embodiment of the DC offset detector 7 wherein the output of the accumulator 19 is stored in a register 71 after every N cycles of the oscillating signal Fn' 5. The value stored in the register 71 is then converted 73 into a suitable pulse width modulated (PWM) signal or a binary rate multiplier (BRM) signal 75 which drives the bias control 25.

Figure 7:
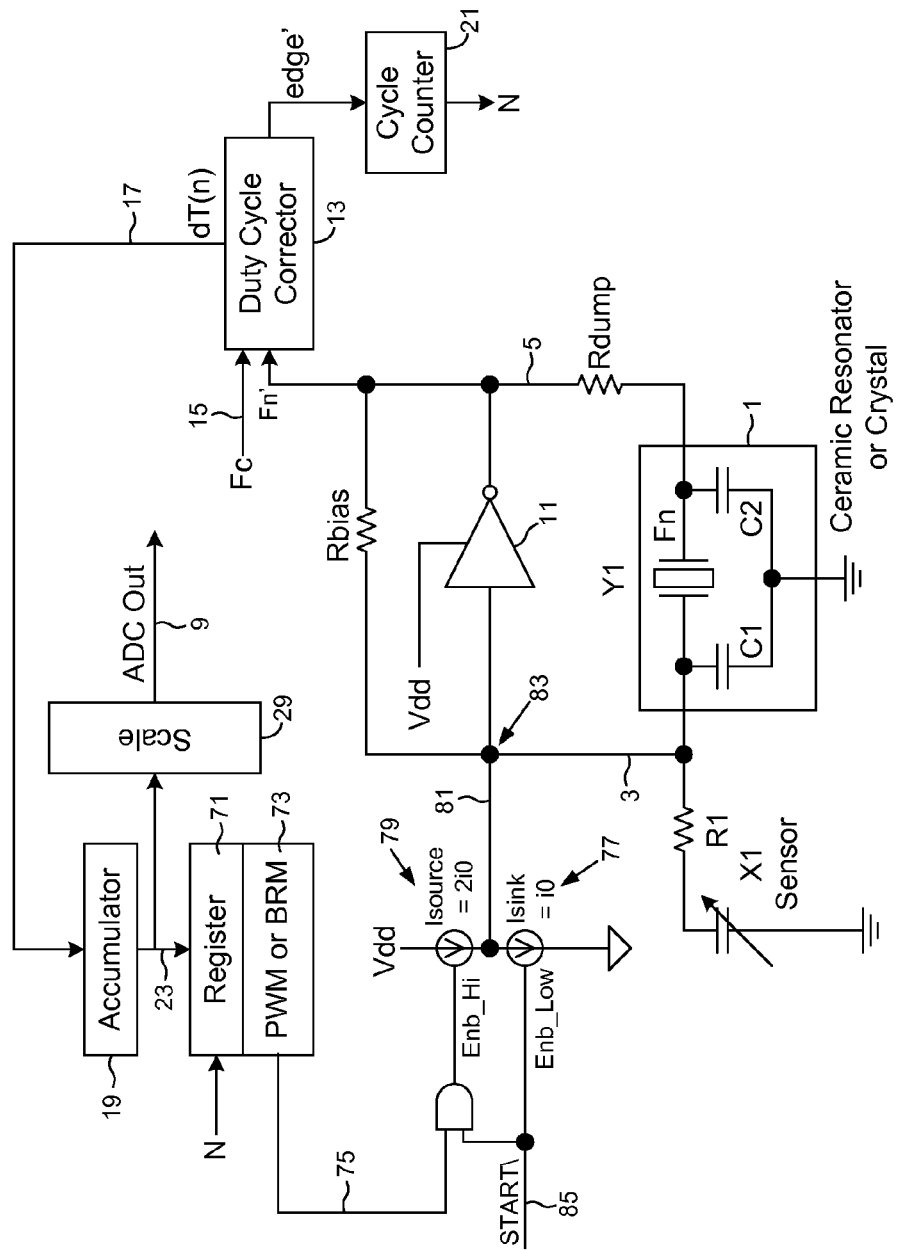
FIG. 7 shows an embodiment of the DC detector according to an embodiment of the present invention.

FIG. 7 shows an embodiment of the bias control 25 wherein the PWM/BRM signal 75 controls the on/off time of a current source 79 that is coupled to a current sink 77. The end result is to supply an average amount of bias current 81 to node 83 that cancels the bias current of the analog input signal 3. In one embodiment, the bias signal 27 generated by the bias control 25 (such the current sink/source embodiment of FIG. 7) has substantially no effect on an input impedance of the resonant oscillator 1. In this manner, the bias signal 27 has minimal affect on the operating characteristics of the resonant oscillator 1. In the embodiment of FIG. 7, a START signal 85 disables the DC offset detector 7 (by disabling the current sink 77 and the current source 79) during a startup operation until the resonant oscillator 1 begins oscillating normally.

The resolution of the analog-to-digital converter is determined by the frequency of the fast clock 15 used to count the time intervals that the oscillating signal Fn' 5 is above and below the threshold, as well as the frequency of the oscillating signal Fn' 5. This is illustrated in FIG. 8A wherein the positive and negative intervals of the oscillating signal Fn' 5 are timed by the fast clock 15 (represented as tick marks) relative to a threshold. In the example shown, the positive interval comprises three cycles of the fast clock 15 (three tick marks), and the negative interval comprises five cycles of the fast clock 15 (five tick marks). This relationship will hold until the DC offset in the oscillating signal Fn' 5 changes by a relatively large step size, thereby resulting in a relatively low conversion resolution of the analog input signal 3.

In one embodiment, the low conversion resolution shown in FIG. 8A is ameliorated if the analog input signal 3 comprises a sufficient amount of noise. This is illustrated in FIG. 8B wherein the noise in the analog input signal 3 causes a corresponding dither in the oscillating signal Fn' 5. The dither in the oscillating signal Fn' 5 will increase the effective conversion resolution by averaging the positive/negative intervals over multiple cycles of the oscillating signal Fn' 5. That is, the dither in the oscillating signal Fn' 5 will cause a different positive/negative interval measurement for different cycles of the oscillating signal Fn' 5, and the average over N cycles will provide a higher resolution conversion as compared to FIG. 8A. The conversion resolution increases with an increasing N; however, the maximum N is limited by the frequency of the analog input signal 3. Accordingly, in one embodiment the frequency of the resonant oscillator 1, the frequency of the fast clock 15, and the number of cycles N to average the positive/negative intervals are selected based on the maximum frequency of the analog input signal 3 in order to achieve a desired performance.

FIG. 8C shows an embodiment for increasing the conversion resolution when the noise in the analog input signal 3 is not sufficient to provide the desired dither effect (or when a lower N value is needed). In this embodiment, the fast clock 15 is verniered by selecting a frequency for the fast clock 15 that is a non-integer multiple of the oscillating signal Fn' 5. For example, in the embodiment of FIG. 8A each cycle of the oscillating signal Fn' 5 spans 8 cycles of the fast clock 15 with the positive/negative intervals timed over 12 cycles of the oscillating signal Fn' 5 (N=12) or 8×12=96 cycles of the fast clock 15. After verniering the fast clock 15, in the embodiment shown in FIG. 8C there are (8×12)+1=97 cycles of the fast clock 15. In another embodiment, there may be (8×12)−1=96 cycles of the fast clock 15. In either embodiment, verniering the fast clock 15 has a similar effect as the noise dithering the oscillating signal Fn' 5 shown in FIG. 8B, thereby increasing the conversion resolution.

FIG. 8D shows an alternative embodiment for increasing the conversion resolution which may be used instead of, or in addition to, the embodiment shown in FIG. 8C. In the embodiment of FIG. 8D, the threshold used to time the positive/negative intervals is dithered, for example, by dithering the threshold of the D-type register 22 shown in FIG. 4. Dithering the threshold as shown in FIG. 8D increases the conversion resolution by averaging over N cycles of the oscillating signal Fn' 5 similar to verniering the fast clock 15 and similar to the noise dithering the oscillating signal Fn' 5 shown in FIG. 8B.

Any suitable timing circuitry may be employed to vernier the fast clock 15 as shown in FIG. 8C and/or dither the threshold as shown in FIG. 8D. In one embodiment, the frequency of the fast clock 15 and/or the frequency of the threshold dither may be determined theoretically through mathematical derivation, or determined empirically during a calibration procedure. Similarly, the value selected for N may be determined theoretically through mathematical derivation, or determined empirically during a calibration procedure. For example, in an embodiment where the analog-to-digital converter is employed in a disk drive, the control circuitry of the disk drive may execute a calibration procedure to calibrate the various parameters that affect the performance of the analog-to-digital converter based on the desired resolution and conversion speed (sample rate).

What is claimed is:

1. An analog-to-digital converter comprising:
   a resonant oscillator comprising an input operable to receive an analog input signal and an output operable to output an oscillating signal; and
   a DC offset detector operable to detect a DC offset in the oscillating signal caused by the analog input signal, wherein the DC offset is converted into a digital output signal representing the analog input signal.

2. The analog-to-digital converter as recited in claim 1, wherein the resonant oscillator comprises a ceramic resonator.

3. The analog-to-digital converter as recited in claim 1, wherein the resonant oscillator comprises a crystal.

4. The analog-to-digital converter as recited in claim 1, wherein the resonant oscillator comprises a silicon oscillator.

5. The analog-to-digital converter as recited in claim 1, wherein the DC offset detector is operable to:
   measure a first time the oscillating signal is above a threshold;
   measure a second time the oscillating signal is below the threshold; and
   detect the DC offset based on a time delta between the first time and the second time.

6. The analog-to-digital converter as recited in claim 5, wherein the DC offset detector is further operable to:
   accumulate a number of the time deltas over a number of cycles of the oscillating signal; and
   detect the DC offset based on the accumulated time deltas.

7. The analog-to-digital converter as recited in claim 6, wherein:
   the DC offset detector is further operable to generate a bias signal in response to the accumulated time deltas; and
   the bias signal is operable to drive the DC offset in the oscillating signal toward zero.

8. The analog-to-digital converter as recited in claim 7, wherein the bias signal has substantially no effect on an input impedance of the resonant oscillator.

9. The analog-to-digital converter as recited in claim 8, wherein the DC offset detector comprises a current source and a current sink operable to generate the bias signal.

10. The analog-to-digital converter as recited in claim 5, wherein the DC offset detector is further operable to Vernier a clock signal used to generate the first and second times in order to increase a resolution of the analog-to-digital conversion.

11. The analog-to-digital converter as recited in claim 5, wherein the DC offset detector is further operable to dither the threshold in order to increase a resolution of the analog-to-digital conversion.

12. A method of converting an analog signal into a digital signal, the method comprising:
   biasing a resonant oscillator with the analog input signal to generate an oscillating signal;
   detecting a DC offset in the oscillating signal caused by the analog input signal, wherein the DC offset; and
   converting the DC offset into the digital signal representing the analog signal.

13. The method as recited in claim 12, wherein the resonant oscillator comprises a ceramic resonator.

14. The method as recited in claim 12, wherein the resonant oscillator comprises a crystal.

15. The method as recited in claim 12, wherein the resonant oscillator comprises a silicon oscillator.

16. The method as recited in claim 12, wherein detecting the DC offset comprises:
   measuring a first time the oscillating signal is above a threshold;
   measuring a second time the oscillating signal is below the threshold; and
   detecting the DC offset based on a time delta between the first time and the second time.

17. The method as recited in claim 16, wherein detecting the DC offset further comprises:
   accumulating a number of the time deltas over a number of cycles of the oscillating signal; and
   detecting the DC offset based on the accumulated time deltas.

18. The method as recited in claim 17, wherein:
   generating a bias signal in response to the accumulated time deltas; and
   drive the DC offset in the oscillating signal toward zero in response to the bias signal.

19. The method as recited in claim 18, wherein the bias signal has substantially no effect on an input impedance of the resonant oscillator.

20. The method as recited in claim 19, further comprising generating the bias signal using a current source and a current sink.

21. The method as recited in claim 16, wherein detecting the DC offset further comprises Verniering a clock signal used to generate the first and second times in order to increase a resolution of the analog-to-digital conversion.

22. The method as recited in claim 16, wherein detecting the DC offset further comprises dithering the threshold in order to increase a resolution of the analog-to-digital conversion.

* * * * *